United States Patent
McConnell et al.

(10) Patent No.: US 8,902,565 B2
(45) Date of Patent: Dec. 2, 2014

(54) ELECTRONIC COMPONENT TERMINATION AND ASSEMBLY BY MEANS OF TRANSIENT LIQUID PHASE SINTERING AND POLYMER SOLDER PASTES

(75) Inventors: John E. McConnell, Pelzer, SC (US); John Bultitude, Greenville, SC (US); Reggie Phillips, Fountain Inn, SC (US); Robert Allen Hill, Simpsonville, SC (US); Garry L. Renner, Easley, SC (US); Philip M. Lessner, Newberry, SC (US); Antony P. Chacko, Greer, SC (US); Jeffrey Bell, Fountain Inn, SC (US); Keith Brown, Simpsonville, SC (US)

(73) Assignee: Kemet Electronics Corporation, Simpsonville, SC (US)

( * ) Notice: Subject to any disclaimer, the term of this patent is extended or adjusted under 35 U.S.C. 154(b) by 388 days.

(21) Appl. No.: 13/114,126

(22) Filed: May 24, 2011

(65) Prior Publication Data
US 2011/0292567 A1 Dec. 1, 2011

Related U.S. Application Data

(60) Provisional application No. 61/348,318, filed on May 26, 2010.

(51) Int. Cl.
| | | |
|---|---|---|
| H01G 4/228 | (2006.01) | |
| H01G 4/06 | (2006.01) | |
| H01G 4/30 | (2006.01) | |
| B23K 1/00 | (2006.01) | |
| B23K 1/20 | (2006.01) | |
| B23K 35/36 | (2006.01) | |
| H01G 4/232 | (2006.01) | |
| B23K 1/008 | (2006.01) | |
| B23K 35/02 | (2006.01) | |
| H01G 4/005 | (2006.01) | |
| B23K 1/005 | (2006.01) | |

(52) U.S. Cl.
CPC ............... *H01G 4/2325* (2013.01); *H01G 4/30* (2013.01); *H01L 2924/01322* (2013.01); *B23K 1/0016* (2013.01); *H01L 2224/83825* (2013.01); *B23K 1/203* (2013.01); *B23K 35/3613* (2013.01); *B23K 1/008* (2013.01); *B23K 35/0227* (2013.01); *H01L 2924/01327* (2013.01); *H01G 4/005* (2013.01); *B23K 1/0053* (2013.01); *B23K 2201/42* (2013.01); *H01L 2924/10253* (2013.01)
USPC ........................ 361/306.3; 361/311

(58) Field of Classification Search
USPC ............................ 361/306.3, 308.1, 309, 311
See application file for complete search history.

(56) References Cited

U.S. PATENT DOCUMENTS

| | | |
|---|---|---|
| 5,038,996 A | 8/1991 | Wilcox et al. |
| 5,221,038 A | 6/1993 | Melton et al. |

(Continued)

OTHER PUBLICATIONS

Ormet CS 510—Technical Data Sheet (Oct. 2012).*

(Continued)

*Primary Examiner* — Eric Thomas
(74) *Attorney, Agent, or Firm* — Joseph T. Guy; Perkins Law Firm, LLC

(57) ABSTRACT

A capacitor has first planer internal electrodes in electrical contact with a first external termination. Second planer internal electrodes are interleaved with the first planer internal electrodes wherein the second planer internal electrodes are in electrical contact with a second external termination. A dielectric is between the first planer internal electrodes and the second planer internal electrodes and at least one of the external terminations comprises a material selected from a polymer solder and a transient liquid phase sintering adhesive.

18 Claims, 7 Drawing Sheets

(56) References Cited

U.S. PATENT DOCUMENTS

| | | | |
|---|---|---|---|
| 5,853,622 | A | 12/1998 | Gallagher et al. |
| 5,964,395 | A | 10/1999 | Glovatsky et al. |
| 6,081,416 | A * | 6/2000 | Trinh et al. ........ 361/308.1 |
| 6,181,544 | B1 * | 1/2001 | Nakagawa et al. ........ 361/321.1 |
| 6,241,145 | B1 | 6/2001 | Maeda et al. |
| 6,704,189 | B2 | 3/2004 | Yoshii et al. |
| 7,023,089 | B1 | 4/2006 | Lu et al. |
| 7,495,890 | B2 | 2/2009 | Chacko |
| 2002/0092895 | A1 | 7/2002 | Blackshear et al. |
| 2004/0240146 | A1 | 12/2004 | Kavatani |
| 2005/0286208 | A1 | 12/2005 | Ito et al. |
| 2006/0151874 | A1 | 7/2006 | Milich et al. |
| 2007/0025060 | A1 * | 2/2007 | Kim et al. ........ 361/321.4 |
| 2007/0152026 | A1 | 7/2007 | Suh et al. |
| 2009/0296311 | A1 | 12/2009 | Otsuka et al. |

OTHER PUBLICATIONS

Ormet 280CE—Technical Data Sheet (Sep. 2009).*
Ormet 701—Technical Data Sheet (2012).*
Sang Min Lee, Written Opinionof the International Searching Authority, PCT/US2011/038197, Dec. 26, 2011.
Sang Min Lee, International Search Report, PCT/US2011/038197, Dec. 26, 2011.
Yeo, In Hong; International Preliminary Report on Patentability, PCT/US2011/038197, Sep. 11, 2012.
Ormet Circuits, Inc.; Silver ProductsMaterial Safety Data Sheet; MSDS No. 0054 Rev A; 5 pgs.; Last update: Jun. 29, 2010.

* cited by examiner

ELECTRONIC COMPONENT TERMINATION AND ASSEMBLY BY MEANS OF TRANSIENT LIQUID PHASE SINTERING AND POLYMER SOLDER PASTES

CROSS-REFERENCE TO RELATED APPLICATIONS

The present application claims priority to pending U.S. Provisional Patent Application No. 61/348,318 filed May 26, 2010 which is incorporated herein by reference.

BACKGROUND

The present invention is related to electronic components and methods of making electronic components. More specifically, the present invention is related to electronic components, and methods of making electronic components, with improved terminations for attachment of an external lead or lead frame to the electronic component such that the component can subsequently be connected to an electronic circuit by a variety of secondary attachment materials and processes.

In general, the method of formation of a conductive termination, and materials used, is critical for reliable performance. The performance in use, when subsequently assembled in an electronic circuit, is directly related to the conductive termination. Historically, lead (Pb) based solders have been used to attach components to electronic circuit boards or to attach external leads to the electronic component. More recently, the use of hazardous substances in electrical and electronic equipment, as typified by the European RoHS legislation, has restricted the use of lead (Pb) in solder which has led the industry to seek various alternatives.

U.S. Pat. No. 6,704,189, for example, describes the use of Sn based solder with 10-30% Sb to form a contact between external leads and plated Multi-Layer Ceramic Capacitor (MLCC) components. However, the solders described have a liquidus below 270° C. By way of comparison, high-Pb solders such as Sn10/Pb88/Ag2 have a liquidus of about 290° C. It is generally recognized in the industry that a melting point 30° C. above any subsequent processing temperature is desirable to insure reliability of the external lead attachment. The ability to achieve high melting points has become critical since solders based on Sn, Ag and Cu, which are referred to in the art as SAC solders, are now becoming the common choice for attachment in Pb-free circuits. SAC solders have to be reflowed at higher temperatures, typically about 260° C., than the older Pb-based alternatives such as Sn63/Pb37 which had a melting point of 183° C. The contact material to the external lead, or for forming the terminal, must be capable of sustaining temperatures well above this in order not to melt, or partially melt, which causes significant reliability issues. A temperature of at least 30° C. above the melting point of the SAC solder is desired.

U.S. Pat. No. 5,038,996 describes coating two mating surfaces one with Sn and the other with Pb and forming a joint by raising the process temperature to a temperature slightly below Sn (183° C.). Transient Liquid Phase Sintering conductive adhesive formulations disclosed in U.S. Pat. No. 5,853,622 combine TLPS materials with cross linking polymers to create an thermally and electrical bond having intermetallic interfaces between the metal surfaces created by TLPS process. The spraying of two mating surfaces with a low temperature melting material and the mating surface with a higher melting temperature material and being compatible with the TLPS process and forming a joint when heating to the melting point of the lower temperature material is discussed in U.S. Pat. No. 5,964,395. These patents describe the materials and processes of TLPS with respect to forming a conductive bond.

U.S. Pat. No. 5,221,038 claims the use of SnBi or Sn In for soldering discrete components such as resistors and the likes to printed circuit boards using the TLPS process. The use of Ag/SnBi coated to two mating surfaces to mount electronic modules to substrates was disclosed in U.S. Pat. No. 6,241,145. US Patent Application No. 2002/0092895 A1 discusses the deposition of materials on two mating surfaces, a substrate and the surface of the bumps on a flip chip, elevated to a temperature to cause diffusion between the materials to create a TLPS compatible alloy. US Patent Application No. 2006/0151871 describes the use of TLPS in forming packages containing SiC or other semiconductor devices bonded to other components or conductive surfaces. US Patent Application No. 2007/0152026 A1 claims the placement of TLPS compatible materials on mating surfaces then reflowing the lower melting point material and then isothermally aging to complete the diffusion process where the two devices to be joined is a MEMS device to a microelectronic circuit. U.S. Pat. No. 7,023,089 B1 claims the use of TLPS to bond heat spreaders made from copper, black diamond, or black diamond copper composite to silicon die. These patents and applications describe the processing of TLPS to bond components to circuit boards but do not contain any teaching regarding their use to form terminations on electronic components or in the attachment of components to lead frames.

In a more recent development US Patent Application No. 2009/0296311 A1 describes a high temperature diffusion bonding process that welds the lead to the inner electrodes of a multi-layer ceramic component. TLPS materials are plated on the faces of mating surfaces to be joined together by introducing heat to initiate the diffusion process. In this case an intimated mutual line of contact is required between the component and lead frame to facilitate the diffusion. This limits the application to joining of surfaces that can form an intimate line of contact and also cannot accommodate components of differing length. Furthermore high temperatures in the range 700 to 900° C. are described to achieve a welded bond that requires pre-heating in order not to damage the multi-layer ceramic component.

Other Pb free attachment technologies are described in the art yet none are adequate.

Solder is an alloy consisting of two or more metals that have only one melting point, which is always lower than that of the metal having the highest melting point and generally, a melting point of less than about 310° C., depending on the alloy. Solder can be reworked, meaning it can be reflowed multiple times, thus providing a means to remove and replace defective components. Solders also make metallurgical bonds by forming intermetallic interfaces between the surfaces they are joining. As solders wet to their adjoining surfaces, they actually flow outward and spread across the surface areas to be joined.

Due to environmental issues associated with lead; tin, silver, and copper solders known as lead free SAC solders were developed for electronics but these are typically reflowed at peak temperatures around 260° C. and the electronic components therefore have to be operated below this temperature. Due to materials compatibility and higher processing temperatures involved with the semi-conductor technologies, gold/germanium and gold/tin alloys were developed to attach die to substrates. Since the die and their mating surfaces have a low difference in TCE, these alloys provided high temperature capabilities and high strengths having tensile strengths in the 20,000 psi+ and shear strengths in the range of 25,000 psi+. However, these materials also require higher processing temperatures due to their higher melting points generally above 350° C. Their high cost and limited application has prevented their wider use in electronics. Tin and Indium have been added to combinations of Zn, Al, Ge and Mg to form higher temperature lead free solders. However, zinc and aluminum powder tend to form oxide films on the surface resulting in poor wettability in the subsequent solders so making them impractical to use. Solders with tin, zinc, cadmium, and aluminum are available but typically used in their eutectic alloy form because their alloys other than eutectic have wide plastic ranges of 50-175° C. limiting their use are for very specific applications outside of the electronics. Cadmium, Zinc, and silver alloy solders are good for soldering aluminum. Once the liquidus temperatures move above 450° C. the solders are referred to brazing solders and are typically used in structural applications rather than electrical applications. Methods of forming Pb-free, high temperature bonds to capacitors that are retain their integrity above 260° C. and are economic to manufacture have therefore yet to be realized.

In spite of the ongoing, and intensive effort, the art still lacks an adequate solution for attaching external leads or lead frames to a multi-layered ceramic capacitor. There is an ongoing need for lead connections with improved reliability for high temperature applications, especially lead (Pb) free.

SUMMARY OF THE INVENTION

It is an object of the invention to provide an improved method for forming metallic external terminals, or for attachment to a lead frame, which can be reflowed without compromising the metallic external leads or lead frame attachment during subsequent assembly into an electronic circuit.

These and other embodiments, as will be realized, are provided in a multilayered ceramic capacitor. The capacitor has first planer internal electrodes in electrical contact with a first external termination. Second planer internal electrodes are interleaved with the first planer internal electrodes wherein the second planer internal electrodes are in electrical contact with a second external termination. A dielectric is between the first planer internal electrodes and the second planer internal electrodes and at least one of the external terminations comprises a material selected from a polymer solder and a transient liquid phase sintering adhesive.

Another embodiment is provided in a multilayered ceramic capacitor. The capacitor has first planer internal electrodes terminating at a first external termination and second planer internal electrodes interleaved with the first planer internal electrodes wherein the first planer internal electrodes terminate at a second external termination. A dielectric is between the first planer internal electrodes and the second planer internal electrodes. A first lead frame is in electrical contact with the first external termination wherein the first lead frame is attached to the first external termination by an adhesive selected from a group consisting of a polymer solder and a transient liquid phase sintering adhesive.

Yet another embodiment is provided in a method for forming a multilayered ceramic capacitor. The method comprises:
forming a monolith comprising:
first planer internal electrodes terminating at a first external termination; second planer internal electrodes interleaved with the first planer internal electrodes wherein the first planer internal electrodes terminate at a second external termination; and
a dielectric between said first planer internal electrodes and said second planer internal electrodes;

providing a lead frame comprising a first lead and a second lead;
attaching the first lead to the first external termination with an adhesive selected from the group consisting of a polymer solder and a transient liquid phase sintering adhesive; and
attaching the second lead to the second external termination with the adhesive.

Yet another embodiment is provided in a method for forming an electronic circuit. The method comprises the steps of:
forming a multilayered ceramic capacitor comprising:
forming a monolith comprising:
first planer internal electrodes terminating at a first external termination;
second planer internal electrodes interleaved with the first planer internal electrodes wherein the first planer internal electrodes terminate at a second external termination;
a dielectric between the first planer internal electrodes and the second planer internal electrodes;
providing a lead frame comprising a first lead and a second lead;
attaching the first lead to the first external termination with an adhesive selected from the group consisting of a polymer solder and a transient liquid phase sintering adhesive; and
attaching the second lead to the second external termination with the adhesive; and
attaching the multilayered ceramic capacitor to a circuit trace.

DETAILED DESCRIPTION

Figure 1:
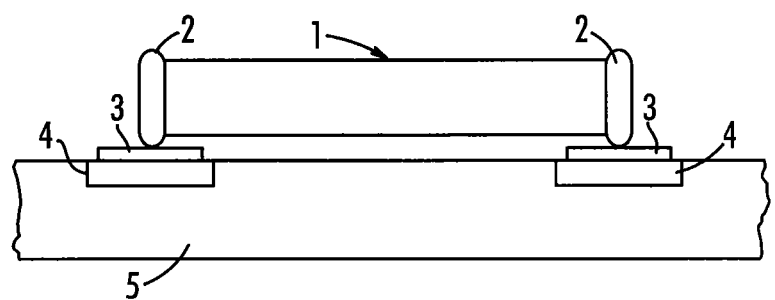
FIG. 1 is a side schematic view of an embodiment of the invention.

The present invention is related to an MLCC with improved bonding to an external lead or lead frame. More specifically, the present invention is related to the use of transient liquid phase sintering adhesive or polymer solder to form a termination to the component or to attach external leads to the component. The improved terminations have the advantage of being able to accommodate different surface finishes as well as components of differing lengths. Furthermore, since no solder balls are formed components can be stacked on top of each other without the gaps normally required for cleaning as with solder attachment technology. The transient liquid phase sintering conductive adhesive or polymer solder can be directly bonded with the inner electrodes of the component and the termination can be formed at low temperature. In a preferred embodiment higher density terminations can be prepared by using a thermo-compression process thereby forming improved external lead attachment bonds.

Transient liquid phase sintering adhesives (TLPS) are conductive materials that are distinguished from solders. Solders are alloys which do not undergo a change in composition after the first reflow. TLPS materials are mixtures of two or more metals or metal alloys prior to exposure to elevated temperatures. The second distinguishing characteristic of TLPS materials is that the melting point of the material is dependent on the thermal history of the material. TLPS materials exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy, forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS conductive adhesives do not spread as they form the intermetallic joint. Rework of the TLPS system is very difficult due to the high secondary reflow temperatures.

Conductive adhesives comprise conductive metal, typically silver, filled polymers that cure or cross link within a specified temperature range, generally 150° C., to form a mechanical bond to the materials to be joined. Their conductivity is created by the metal particles which make intimate contact with one another, within the confines of the polymer matrix, to form an electrically conductive path from one particle to another. Because the binder is organic in nature, they have relatively low temperature capabilities, normally in the range of about 150° C. to about 300° C. Conductive epoxies, once cured, cannot be reworked. Conductive epoxies do not wet or flow as they cure as do solders when they melt.

Polymer solders may comprise conventional solder systems based on Pb/Sn alloy systems or lead free systems, such as Sn/Sb, which are combined with cross linking polymers which serve as cleaning agents. The cross-linked polymers also have the ability to form a cross linked polymer bond, such as an epoxy bond, that forms during the melting phase of the metals thereby forming a solder alloy and a mechanical polymeric bond. An advantage of polymer solders is that the polymeric bond provides additional mechanical bond strength at temperatures above the melting point of the solder, thus giving the solder joint a higher operating temperature in the range of about 5 to 80° C. above the melting point of the solder. Polymer solders combine current solder alloys with a cross linking polymer within the same paste to provide both a metallurgical bond and a mechanical bond when cured, such as by heating, to provide additional solder joint strength at elevated temperatures. However, the upper temperature limits and joint strength has been increased, just by the physical properties of the materials. A practical limit of 300° C. remains whereas the transient liquid phase sintering conductive adhesives can achieve higher temperatures.

In one embodiment the polymer solder bond may be complimentary wherein, instead of the preferred mixture of polymer and solder, the polymer forming components and metallurgical bond forming components may be separate with both between the faces to be mated.

A TLPS or polymer solder paste can form a termination on an electronic component that can subsequently be attached to an electronic circuit by other methods and/or materials. A metallurgical intermetallic bond is formed that can be lead (Pb) free which has improved joint strength compared to other material types such as Pb-free solder at elevated temperatures. The TLPS or polymer solder joint may be made directly with a buried electrode or electrodes within the component or through other materials in contact with these electrodes. The TLPS or polymer solder joint does not have to overlap the edge of the component.

The use of TLPS or a polymer solder in paste form allows uneven surfaces to be joined. More specifically, the use of TLPS or polymer solder in paste form allows two irregular shaped surfaces to be joined with no intimate, or continuous, line of contact. This is particularly advantageous compared to plated surfaces that are subsequently diffusion bonded where the surfaces have to be in an intimate continuous line of contact during this process. This also allows electronic components of differing lengths to be combined within a stack or stacked within a lead frame. Since the transient liquid sintering phase conductive adhesive does not form solder balls the stacked components can be placed on top of one another with the terminations in the same orientation with no gaps required for cleaning as needed in conventional attachment using solder.

Since the TLPS or polymer solder pastes do not flow like a conventional solder there is no need to employ solder dams on the lead frames. This feature provides a significant manufacturing convenience.

The TLPS or polymer solder paste can be used to form bonds between 2 or more components to each other or within a common lead frame. In the case of the lead frame, components of different lengths can be attached and there is no need for gaps between the components to clean solder balls since these do not occur. The resulting stacks are therefore thinner than if assembled with conventional solder. Polymer solders minimize solder balls and TLPS eliminates solder balls.

In some cases it may be desirable to apply the pastes to either surface being joined or use combinations of TLPS and polymer solder. With TLPS paste thermo-compression bonding can be used to increase densities in the bond thereby forming more reliable joints than when relying on temperature alone. Both the mechanical properties and electrical properties are improved by thermo-compression bonding.

Transient liquid sintering phase conductive adhesive can be used to form a bond to the inner electrode of the electronic component. This is particularly beneficial when the component is a multi-layer ceramic capacitor since this does not require other materials to be attached prior to forming the termination or bond to an external lead or lead frame.

It is particularly preferred that a low temperature be used to form an initial bond between the transient liquid phase sintering conductive adhesive and a component. Formation of the initial bond is followed by isothermal aging to generate a high temperature joint capable of sustaining higher temperatures. The reflow temperatures occur during attachment of the component to a circuit using a secondary attachment process and are less than the melt temperature of the highest melting element and the melt temperature of the alloy formed during the heating to form the initial bond. This is favorable compared to SAC type solder that requires a reflow of about 260° C.

A two step reflow can be also used with transient liquid phase sintering conductive adhesive wherein in the first step an electrically conductive metallurgical bond is formed at low temperature using a relatively short time cycle, in the range of 5 seconds to 5 minutes, and low temperature, in the range of 180° C. to 280° C., depending on the metals being used in the TLPS alloying process. In the second step the part is subjected to an isothermal aging process using a temperature range of 200° C. to 300° C. for a longer duration such as, but not limited to, 5 minutes to 60 minutes. The shorter times required to form the initial bond are well suited for an automated process. In another method a single step process can be used wherein the transient liquid phase sintering conductive adhesive forms a terminal, or conductive metallurgical bond, between the external leads and electronic component(s) at temperatures of, for example, 250° C. to 325° C. for a duration of, for example, 10 seconds to 30 seconds. Lower temperatures, such as 175° C. to 210° C., can be used for a longer duration, such as 10 to 30 minutes. This is particularly useful when the electronic component itself is sensitive to temperature.

Typically, the transient liquid phase sintering conductive adhesive terminations are cured, preferably by heating, using a one step sintering process making an electrically conductive metallurgical bond at a temperature range of, but not limited to, 190° C. to 220° C., for a time of, but not limited to, 10 minutes to 30 minutes. It is most preferred that the second melt temperature exceed the first melt temperature by at least 80° C. The metallic bond can have a second melting temperature in excess of 400° C., thus making this technology a viable option for a low temperature processing lead (Pb) free solution suitable for use in subsequent high temperature applications. However, this type of process is more suited for batch type processes typical of semiconductor processing and some PCB processing but it is not conducive for high volume in-line termination and external lead attachment for electronic components including multi-layer ceramic capacitors. Furthermore, processing transient liquid phase sintering conductive adhesives in this way can result in a high degree of porosity particularly with high levels of organic content.

Transient liquid phase sintering conductive adhesive materials can be processed using a two step process to achieve favorable interconnect joints. The first step forms a robust electrically conductive metallurgical joint in a relatively short process time of 30 seconds or less at a temperature in the range of 225° C. to 300° C. The second step is a sintering step that subjects the parts to a temperature of 200° C. to 250° C., or less, for a time of 5 minutes to 30 minutes to complete the alloying process. The two step process is satisfactory for high volume in-line assembly where a subsequent batch sintering process is acceptable. However, as with the aforementioned single step process the porosity is often undesirably high.

In many applications a high degree of porosity may be acceptable. However, in harsh environments, such a high humidity or in circuit board mounting processes, high porosity is not desirable since water or other chemicals may penetrate through the bond which may cause the component to fail. A preferred embodiment of this invention is therefore to form a low porosity termination with transient liquid phase sintering conductive adhesives using a thermo-compression bonding process. This process has the added advantage of using a low process time of 15 to 30 seconds at a temperature in the range of 225° C. to 300° C. in a single step making it suitable for automation. Robust joints can be created for the application of attaching external leads to MLCC's using transient liquid phase sintering conductive adhesives with a one step low temperature in less than 30 seconds and in combination with thermo-compression bonding.

Thermo compression bonding is also a preferred processing method when using polymer solder because it assists in the formation of a high density metallurgical bond between the contacting surfaces. The advantages of thermo-compression include a more robust bond with respect to secondary attachment processes and attachments with higher strength are achieved. A compressive force of 0.5 to 4.5 Kilograms/$cm^2$ (7.1 to 64 psi) and more preferably 0.6 to 0.8 Kilograms/$cm^2$ (8.5 to 11 psi) is sufficient for demonstration of the thermo-compression teachings herein. About 0.63 Kilograms/$cm^2$ (9 psi) is a particularly suitable pressure for demonstration of the teachings.

TLPS comprise high temperature materials selected from copper, silver, aluminum, gold, platinum, palladium, beryllium, rhodium, nickel, cobalt, iron and molybdenum or a mixture or any combination thereof are suitable for use in transient liquid phase sintering conductive adhesives. The lead (Pb) free transient liquid phase sintering adhesives preferably use either silver or copper as the high temperature component and a tin-bismuth alloy as the low temperature component.

TLPS further comprises low temperature materials selected from tin, antimony, bismuth, cadmium, zinc, gallium, indium, tellurium, mercury, thallium, selenium, or polonium, or a mixture or an alloy of any two or more of these.

The transient liquid phase sintering conductive adhesives are compatible with surface finishes containing silver, tin, gold, copper, platinum, palladium, nickel, or combinations thereof, either as lead frame finishes, component connections or inner electrodes to form an electronically conductive metallurgical bond between two surfaces. Suitable external lead or lead frame materials include phosphor bronze, copper, alloys of copper such as but not limited to beryllium copper, Cu194 and Cu192, as well as lead frames consisting of ferrous alloys such as but not limited to Alloy 42 and Kovar.

Heating can be done by any method known in the art with convection heating, radiant heating and induction heating being most preferred.

The invention will be described with reference to the figures which form an integral, non-limiting, component of the disclosure. Throughout the various figures similar elements will be numbered accordingly.

An embodiment of the invention will be described with reference to the cross-sectional side view in FIG. 1. In FIG. 1, an electronic component, 1, such as an MLCC, comprises terminations, 2, selected from transient liquid phase sintering conductive adhesive or polymer solder termination. The termination is attached to contact pads, 4, on an electronic circuit board substrate, 5, using a secondary attachment material, 3. It can be seen that in this way electronic components with many terminations formed with transient liquid phase sintering conductive adhesive or polymer solder can be attached to a circuit.

Figure 2:
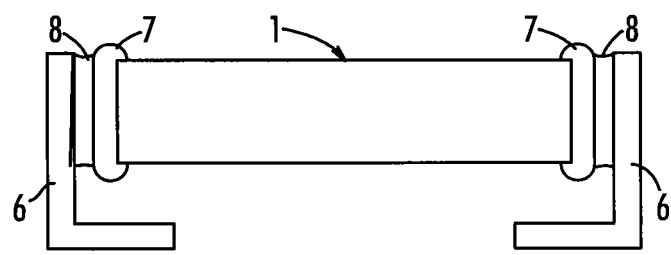
FIG. 2 is a side schematic view of an embodiment of the invention.

The use of the transient liquid phase sintering conductive adhesive or polymer solder termination to form a conductive bond to an external lead is shown in FIG. 2 wherein the electronic component, 1, is connected to an external lead or lead frame, 6, with a transient liquid phase sintering conductive adhesive or polymer solder, 8, between the external lead frame and external termination, 7.

Figure 3:
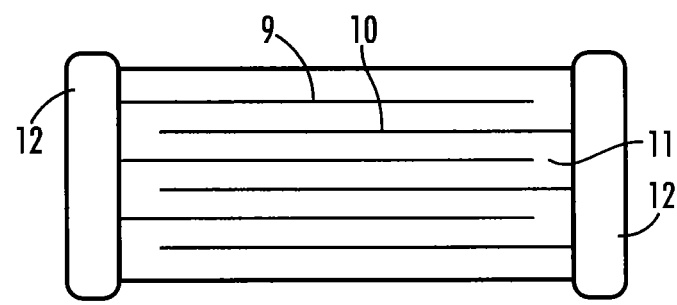
FIG. 3 is a cross-sectional schematic view of an embodiment of the invention.

In FIG. 3, transient liquid phase sintering conductive adhesive or polymer solder external terminals, 12, are in direct contact with the inner electrodes, 9 and 10, of a multi-layer ceramic capacitor. The interleaved planer inner electrodes of alternating polarity are separated by a dielectric, 11, and alternating inner electrodes are in direct contact with opposing external terminations, 12, formed by the transient liquid phase sintering conductive adhesive or polymer solder. This embodiment provides an additional benefit of avoiding the processing costs associated with forming other connecting materials on the electronic component.

Figure 4:
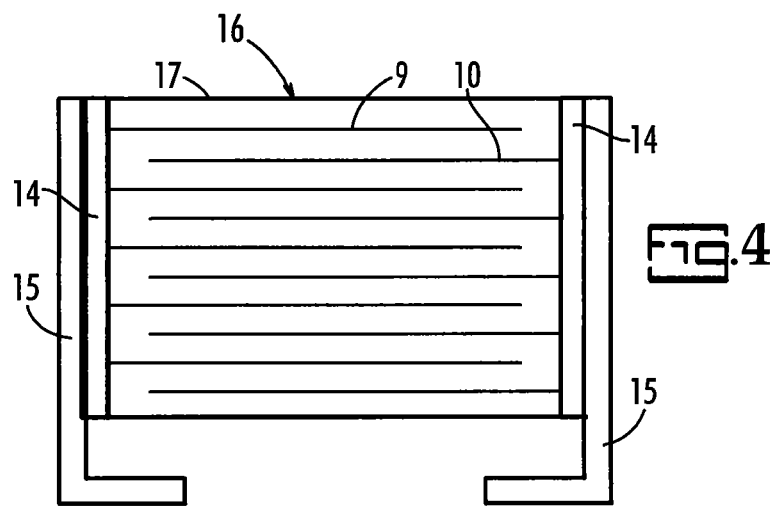
FIG. 4 is a cross-sectional schematic view of an embodiment of the invention.

In FIG. 4 transient liquid phase sintering conductive adhesive or polymer solder terminations, 14, bond an external lead, 15, to the inner electrodes, 9 and 10, and do not extend past the edge, 17, of the multi-layer ceramic capacitor body, 16. This embodiment reduces the amount of materials required for terminations and the failures that occur at this overlap area due to mechanical stress are eliminated.

Figure 5:
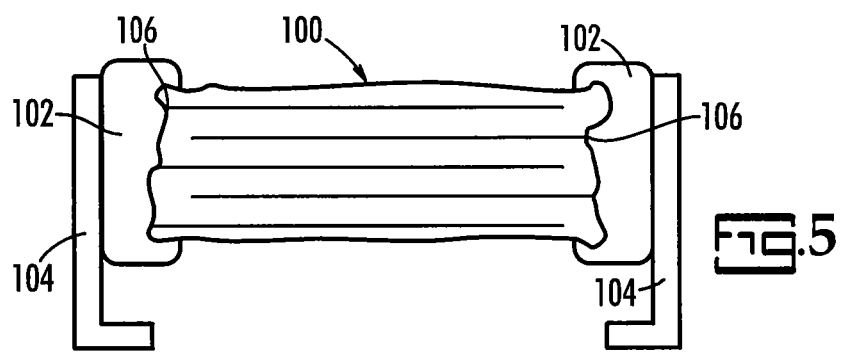
FIG. 5 is a side cross-sectional schematic view of an embodiment of the invention.

In FIG. 5 a cross-section of an electronic component is shown, in this case a multi-layer ceramic capacitor, 100, with transient liquid phase sintering conductive adhesive or polymer solder terminations, 102, contacts through a conductive interconnect to external leads, 104. The edge, 106, has no continuous intimate line of contact between the conductive connection and the external leads. This invention does not require the two surfaces of the external lead and conductive interconnect when mated together to form a continuous line of intimate contact.

Figure 6:
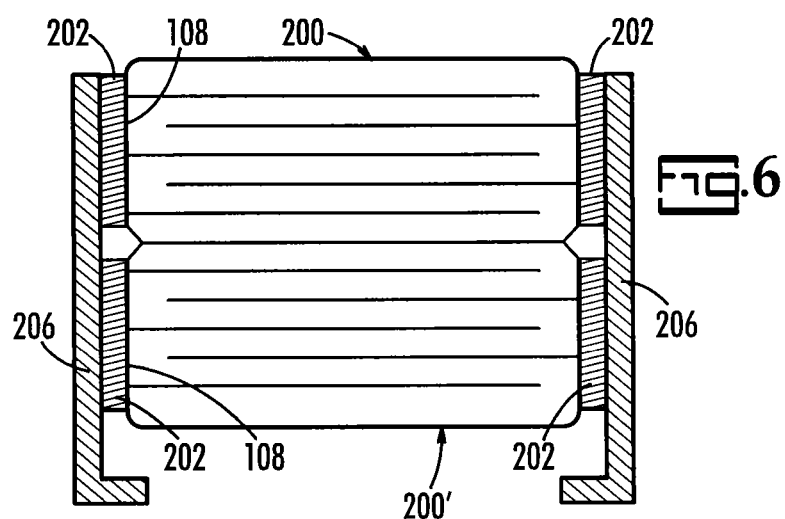
FIG. 6 is a side cross-sectional schematic view of an embodiment of the invention.

An embodiment of the invention is illustrated in FIG. 6. In FIG. 6, two MLCC's, 200 and 200', between lead frames, 206, are illustrated for the purposes of discussion with the understanding that many could be stacked. Each MLCC has a transient liquid phase sintering conductive adhesive or polymer solder terminations, 202, which covers only a portion of the edges, 108, of the MLCC. This allows the MLCC's to be closely spaced with a minimum, or no gap, between the faces of the MLCC.

Figure 7:
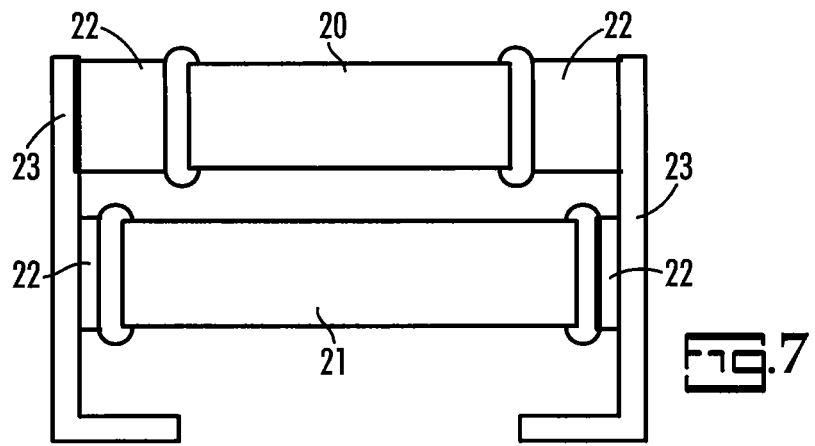
FIG. 7 is a cross-sectional schematic view of an embodiment of the invention.

An embodiment of the invention is illustrated in FIG. 7 as a schematic side view of stacked MLCC's wherein the two MLCC's, 20 and 21, have different widths. The transient liquid phase sintering conductive adhesive or polymer solder terminations, 22, can accommodate electronic components of differing lengths with adequate contact to the external leads, 23. In this way components of differing lengths up to 2.54 mm (0.10 inches) can be attached within the same stack even though it is preferable that the lengths differ by no more than 0.254 mm (0.010 inches).

Figure 8:
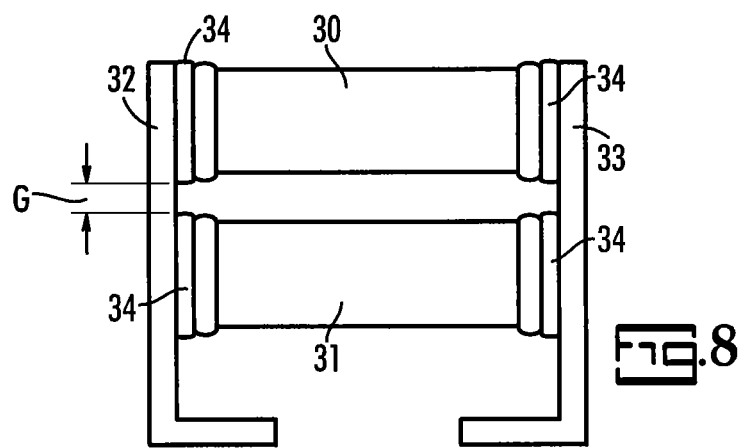
FIG. 8 is a side schematic view of stacked MLCC's.

FIG. 8 illustrates a cross-sectional schematic view of a stack of two components, 30 and 31, attached to external leads 32 and 33 using a conventional solder 34. In this case a gap, G, of at least 0.254 mm (0.010") is required between the components to allow for post assembly cleaning to remove solder balls.

Figure 9:
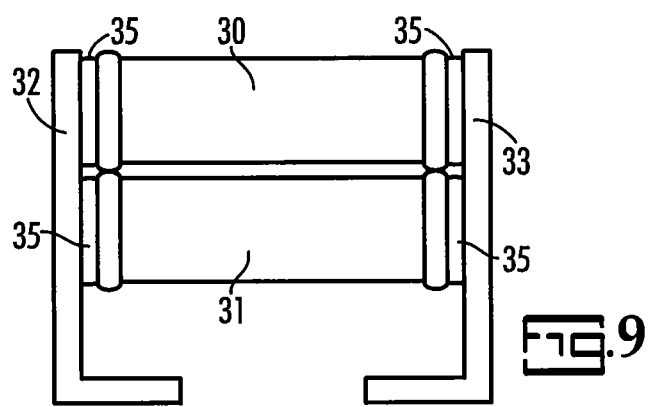
FIG. 9 is a side schematic view of an embodiment of the invention.

FIG. 9 illustrates, in cross-sectional side schematic view, an embodiment of this invention with a stack of two components, 30 and 31, attached to external leads, 32 and 33, using a transient liquid phase sintering conductive adhesive or polymer solder, 35. In this case a gap of less than 0.254 mm, and preferably no gap, can be used between the components since no solder balls are formed and therefore cleaning is not required. Elimination of the gap allows an overall reduction in height of the stack thereby reducing the vertical space required for the electronic components. Furthermore, for stacks of more than two components the savings in space will be even greater.

EXAMPLES

The slump test is based on a visible observation, preferably with magnification, wherein the part is inspected after treatment to see if the MLCC has moved, or slumped, within the lead frame. Slumping indicates that the reflow process has caused the integrity of the bond to the lead frame to be compromised. A failure is indicated by a movement of the MLCC within the lead frame or a visual indication of a loss of bond integrity.

Example 1

Improved Mechanical Robustness of Polymer Solder

Sixty eight identical stacks each having 2 MLCC's with a case size of 0.22×0.20 inches mounted in a common lead frame were manufactured. The stacks were separated into two equal sets of 34 each. One set was a control set wherein the lead frame was attached to each MLCC using 1 mg of Sn/Sb solder with 91.5 wt % Sn and 8.5 wt % Sb. The second set was an inventive set wherein a lead frame was attached to each MLCC using 1 mg of Sn/Sb polymer solder with 91.5 wt % Sn and 8.5 wt % Sb available from Henkel as 10048-11A polymer solder. Each component was passed through a solder reflow oven at 260° C. three times and the part examined after each pass to determine the number of chips slumped. The results are provided in Table 1 wherein the cumulative number of failed parts is recorded after each pass.

TABLE 1

| Adhesive type | Pass #1 | Pass#2 | Pass#3 |
|---|---|---|---|
| Control | 4 | 5 | 6 |
| Inventive | 0 | 0 | 0 |

The results in Table 1 indicate that, for the control, 4 parts failed in the first pass and one additional part failed in subsequent passes whereas none of the inventive samples failed. The polymer solder therefore added additional mechanical strength at elevated temperature compared to the solder of the control samples.

Example 2

Improved Mechanical Robustness of TLPS

Similar stacks were manufactured with silver or tin plated lead frames and attached with a Cu-based transient liquid phase sintering adhesive available as Ormet 328. The samples did not exhibit any slumping or external lead detachment. A load test was then conducted as described in U.S. Pat. No. 6,704,189 wherein the stacks were placed in an oven with a 30 g weight attached to the MLCC and suspended below the stack. The temperature was increased above 260° C. in steps of at least 10° C. with a 10 minute dwell at each temperature. The parts were then examined for slumping and or external lead detachment failures. In the case of silver plated external lead frames failures were detected at 630° C. but for Sn plated lead frames the first failures were detected at 360° C. demonstrating a superior high temperature mechanical performance for transient liquid phase sintering conductive adhesive.

Example 3

Temperature Capability of Polymer Solder

Figure 10:
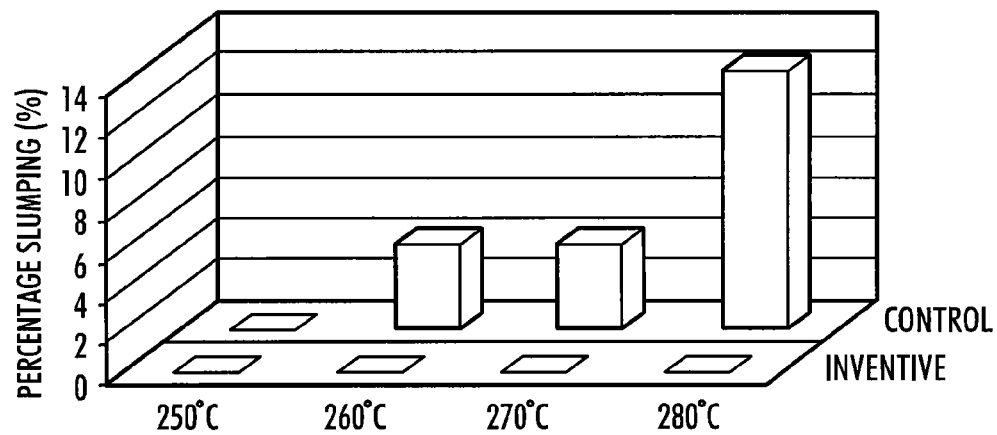
FIG. 10 is a graphical representation of an embodiment of the invention.

One hundred and twenty J-lead style stacks were manufactured using identical MLCC's, identical J-leads and thermocompression bonding process. The samples were split into groups of 30 and each bonded using various volumes of 91.5/8.5 Sn/Sb solder, available as Henkel 92ADA100DAP85V EU 2460, for the control samples and polymer solder, available as Henkel 20048-11A, as the inventive samples containing the same solder composition. The samples were then sent through various soldering ovens over three passes and at different temperatures. The samples were then assessed for part slumping. The results are shown in FIG. 10. No slumping was detected in the polymer solder samples indicating improved high temperature robustness.

Example 4

Durability of Polymer Solder to High Speed Secondary Assembly Processes

J-lead style stacks were manufactured using identical MLCC's, identical J-leads and a thermo-compression bonding process. Controls were prepared using 91.5/8.5 Sn/Sb solder available as Henkel 92ADA100DAP85V EU 2460. Inventive samples were prepared using a polymer solder containing the same solder composition which is available as Henkel 20048-11A. The samples were subsequently assembled onto FR4 boards with a standard solder and sent through an IR reflow oven using a faster temperature ramp rate than recommended for the soldered lead frames. The samples were examined for slumping or lead frame contact failure. The samples containing the Sn/Sb solder had 9 failures of 15 samples whereas the polymer solder had 0 failures of 15 samples demonstrating the increased robustness with respect to high speed assembly. The parts were subjected to the same high speed assembly.

Example 5

Thermo-Compression Bonding

Figure 11:
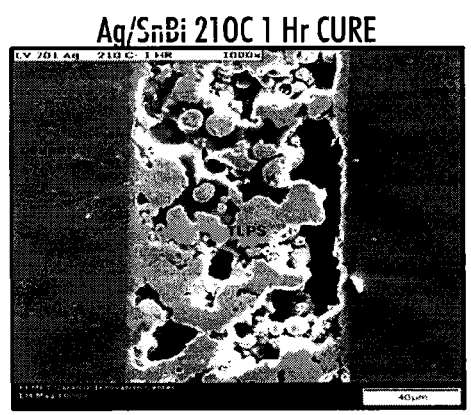
FIGS. 11 and 12 are electron micrographs of cross-sections of coupons bonded in accordance with an embodiment of the invention.
Figure 12:
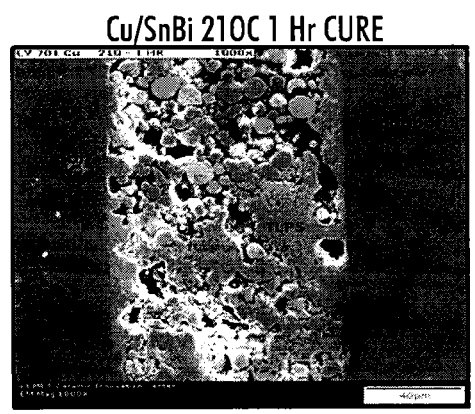
Figure 13:
FIGS. 13 and 14 are electron micrographs of cross-sections of coupons bonded in accordance with an embodiment of the invention.
Figure 14:

FIGS. 11 and 12 are photomicrographs demonstrating the bonds achieved using TLPS Ag/Sn/Bi, available as Ormet 701 Series, and Cu/Sn/Bi, available as Ormet 280 CE Series, to bond between coupons of Ag plated phosphor bronze using an IR reflow process. Significant areas of voids are present. FIG. 13 is a photomicrograph showing the TLPS Ag/Sb/Bi after a thermo-compression bonding process and FIG. 14 is a photomicrograph showing the Cu/Sb/Bi after a thermo-compression bonding process. In both instances a dense microstructure is observed. Thermo-compression can be achieved very quick such as less than 5 minutes with 2-10 pounds of compression.

Coupons were prepared in an analogous fashion to Example 4. A 30 g weight was suspended from the device thereby placing a stress on the thermo-compression bond. The bond was subjected to increasing temperatures. No failures were observed even with heating up to 850° C.

On observation, with lead attachments using Cu/Sn/Bi TLPS available as Ormet 701 and 10/88/2 Sn/Pb/Ag solder the TLPS remains where it was deposited whereas solder flows on heating. Solder requires the use of solder dams and resists when used with external lead attachment whereas TLPS does not. This provides a significant manufacturing advantage.

Figure 15:
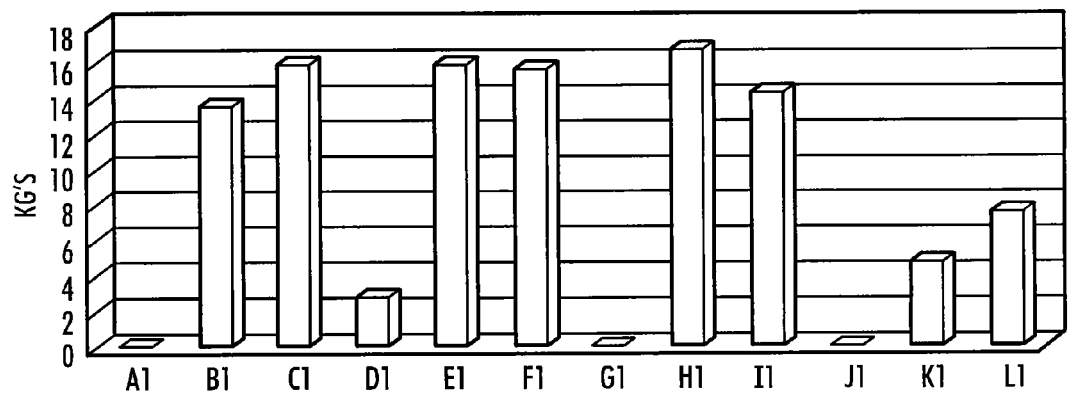
FIGS. 15-18 are graphical representations illustrating advantages provided by the invention.

FIG. 15 is a bar chart illustrating the results of a pull, or shear, test using Ormet 701 Cu/Sn/Bi TLPS to bond matte plated Sn Phosphor bronze coupons using thermo-compression bonding at various conditions with and without post curing. These results are compared to a 91.5Sn/8.5Sb solder. In FIG. 15, Sample A1 was heated at 180° C., for 20 seconds with no post curing, Sample B1 was heated at 180° C. for 15 sec. with a 20 minute post cure at 210° C. Sample C1 was heated at 180° C. for 20 sec. with a 30 minute post cure at 210° C. Sample D1 was heated at 190° C. for 20 sec. with no post cure. Sample E1 was heated at 190° C. for 20 sec. with a 15 minute post cure at 210° C. Sample F1 was heated at 190° C. for 20 sec. with a 30 minute post cure at 210° C. Sample G1 was heated at 200° C. for 20 sec. with no post cure. Sample H1 was heated at 200° C. for 20 sec. with a 15 minute post cure at 210° C. Sample II was heated at 200° C. for 20 sec. with a 30 minute post cure at 210° C. Sample J1 was heated at 200° C. for 10 sec. with no post cure. Sample K1 was heated at 230° C. for 10 sec. with no post cure. Sample L1 was heated at 210° C., mimicking a post cure, for 30 minutes using 91.5Sn/8.5Sb solder.

Example 6

Figure 16:
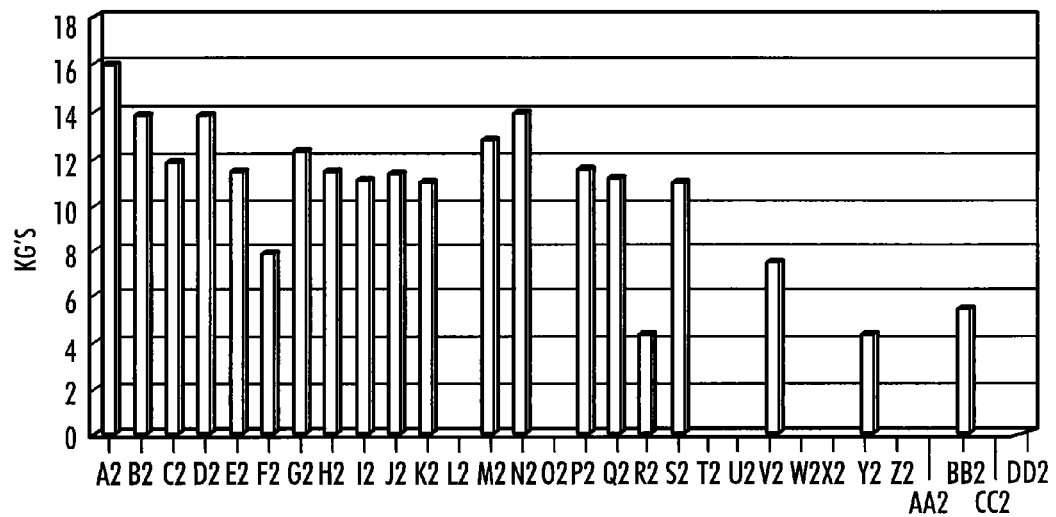

A set of experiments, similar to Example 5, was performed using Ormet 280CE Ag/Sn/Bi on a silver plated coupon. The results are provided in a bar graph in FIG. 16. In the examples the external lead exhibits a shear strength, measured as peak pull (in Kg) to failure, which exceeds the solder even though no post cure was used in the thermo-compression process. In each case the samples were heated at a first temperature for a first period of consistent with a preheat, then the temperature was ramped to a second temperature in three seconds and the samples were held at the second temperature for a period of time. In FIG. 16 Sample A2 was preheated at 140° C. for 10 sec., the temperature was ramped to 300° C. and held for 20 sec. Sample B2 was preheated at 140° C. for 10 sec., the temperature was ramped to 300° C. and held for 10 sec. Sample C2 was preheated at 140° C. for 10 sec., the temperature was ramped to 300° C. and held for 5 sec. Sample D2 was preheated at 140° C. for 3 sec., the temperature was ramped to 300° C. and held for 20 sec. Sample E2 was preheated at 140° C. for 3 sec., the temperature was ramped to 300° C. and held for 10 sec. Sample F2 was preheated at 140° C. for 3 sec., the temperature was ramped to 300° C. and held for 5 sec. Sample G2 was preheated at 140° C. for 10 sec., the temperature was ramped to 280° C. and held for 20 sec. Sample H2 was preheated at 140° C. for 10 sec., the temperature was ramped to 280° C. and held for 10 sec. Sample I2 was preheated at 140° C. for 10 sec., the temperature was ramped to 280° C. and held for 5 sec. Sample J2 was preheated at 140° C. for 3 sec., the temperature was ramped to 280° C. and held for 20 sec. Sample K2 was preheated at 140° C. for 3 sec., the temperature was ramped to 280° C. and held for 10 sec. Sample L2 was preheated at 140° C. for 3 sec., the temperature was ramped to 280° C. and held for 5 sec. Sample M2 was preheated at 140° C. for 10 sec., the temperature was ramped to 260° C. and held 20 sec. Sample N2 was preheated at 140° C. for 10 sec, ramped to 260° C. and held for 10 sec. Sample O2 was preheated at 140° C. for 10 sec., the temperature was ramped to 260° C. and held for 5 sec. Sample P2 was preheated at 140° C. for 3 sec., the temperature was ramped to 260° C. and held for 20 sec. Sample Q2 was preheated at 140° C. for 3 sec., the temperature was ramped to 260° C. and held for 10 sec. Sample R2 was preheated at 140° C. for 3 sec., the temperature was ramped to 260° C. and held for 5 sec. Sample S2 was preheated at 140° C. for 10 sec., ramped to 240° C. and held for 20 sec. Sample T2 was preheated at 140° C. for 10 sec., the temperature was ramped to 240° C. and held for 10 sec. Sample U2 was preheated at 140° C. for 10 sec., the temperature was ramped to 240° C. and held for 5 sec. Sample V2 was preheated at 140° C. for 3 sec., the temperature was ramped to 240° C. and held for 20 sec. Sample W2 was preheated at 140° C. for 3 sec., the temperature was ramped to 240° C. and held for 10 sec. Sample X2 was preheated at 140°

C. for 3 sec., the temperature was ramped to 240° C. and held for 5 sec. Sample Y2 was preheated at 140° C. for 10 sec., the temperature was ramped to 220° C. and held for 20 sec. Sample Z2 was preheated at 140° C. for 10 sec., the temperature was ramped to 220° C. and held for 10 sec. Sample AA2 was preheated at 140° C. for 10 sec., the temperature was ramped to 220° C. and held for 5 sec. Sample BB2 was preheated at 140° C. for 3 sec., the temperature was ramped to 220° C. and held for 20 sec. Sample CC2 was preheated at 140° C. for 3 sec., the temperature was ramped to 220° C. and held for 10 sec. Sample DD2 was preheated at 140° C. for 3 sec., the temperature was ramped to 220° C. and held for 5 sec.

Example 7

TLPS Termination

TLPS Cu/Sn/Bi, available as Ormet 701, was cured onto nickel base metal electrode MLCC's to form a termination directly to the nickel inner electrodes. The average capacitance was 0.32 pF similar to that for standard high fire termination materials indicating a bond with a continuous conductive pathway had been formed to the inner electrodes.

Example 8

Temperature Durability Test

Figure 17:
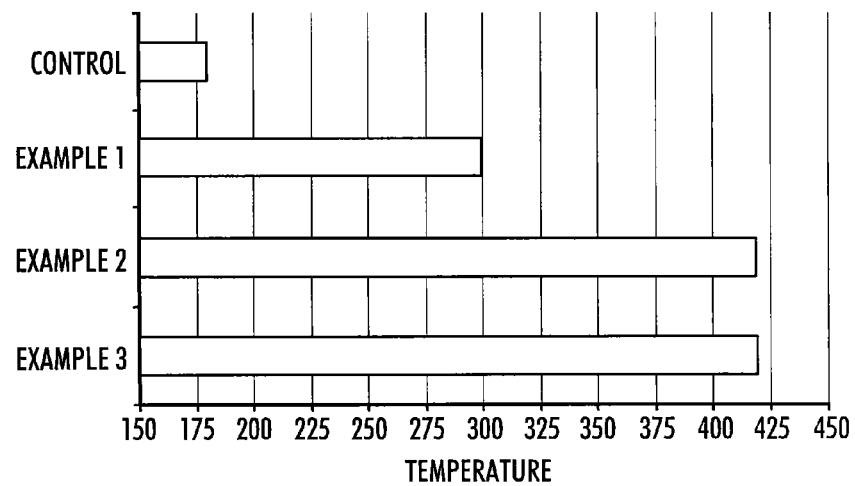

To test the strength of the adhesive bond a load test was done in accordance with U.S. Pat. No. 6,704,189 wherein the externally leaded part is suspended in air with a 30 gram weight attached to the bottom external lead. The suspended part and weight are subjected to increasing temperatures until failure is detected by detachment of the external lead wires. The results are presented in FIG. 17 wherein the inventive sample utilizing polymer solder demonstrates a significantly better bond strength, as a function of temperature, than the control using 88Pb/10Sn/2Ag solder. In FIG. 17, the control was bonded using 88Pb/10Sn/2Ag solder. Example 1a nickel/tin lead was bonded with conductive adhesive. Example 2 was bonded to a nickel/gold lead using conductive adhesive. Example 3 was bonded to a nickel/silver lead with a 95Sn/5Ag solder dot in the center and conductive adhesive on the nail head.

Figure 18:
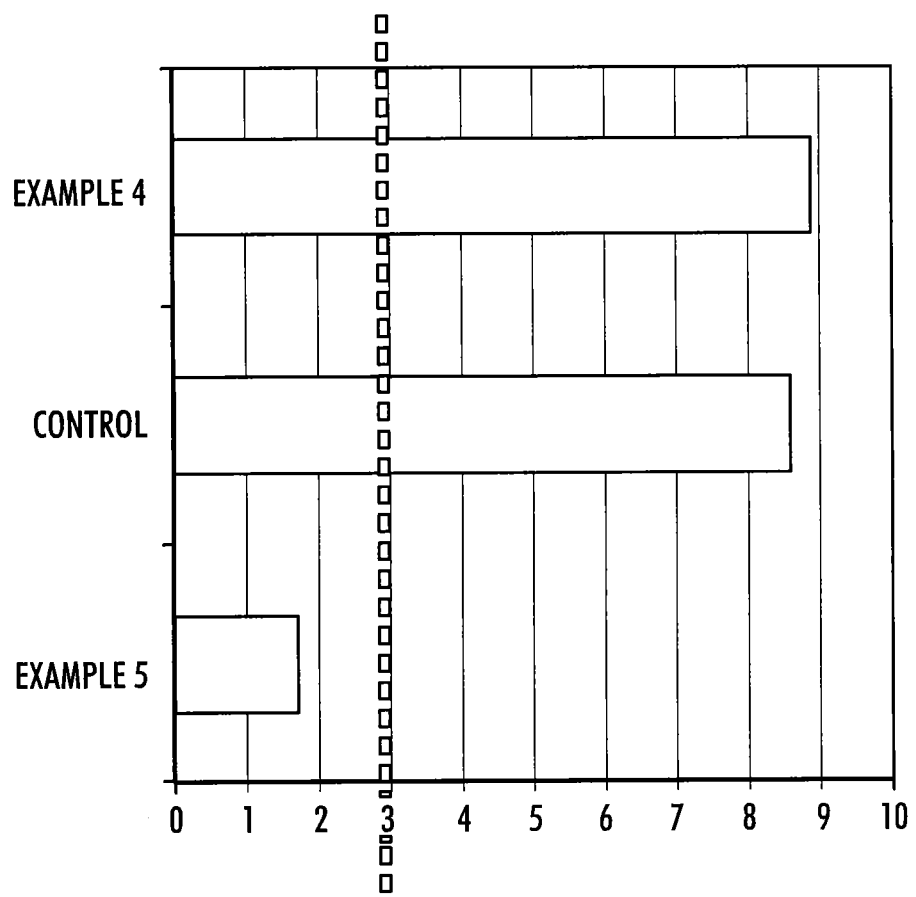

Similar samples were subjected to a shear strength test conducted in accordance with Mil-Std-202G, Method 211, Test Condition A, Procedure 3.1.3 wherein the load applied is axial to the capacitor terminals and the force is increased and monitored until the device fails. The results are provided in FIG. 18. In FIG. 18, Example 4 utilized a dot of polymer solder with Sn95/Ag5 which was reflowed then bonded to a silver plated nail head with conductive adhesive and post reflow cured. The control used Sn95/Ag5 solder and Example 5 used a conductive adhesive to bond to a silver plated lead wire. As demonstrated the conductive epoxy exhibited a poor shear adhesion of less than 3 lbs. resulting in inadequate handling strength for processing.

The inventive sample withstands greater than 400° C. with a 30 gram weight suspended from the external lead wire. Conductive adhesive alone survived >300° C. temperatures, but exhibits poor shear adhesion at room temperature as shown in FIG. 18. This is not acceptable for processing and handling of the part after joining such is common during assembly of subcomponents and electronic devices. Shear testing of the current invention showed an acceptable room temperature shear strength of >3 lbs.

The invention has been described with reference to the preferred embodiments without limit thereto. One of skill in the art would realize additional embodiments and alterations which are not specifically set forth but which are within the scope of the claims appended hereto which form an integral part of the instant application.

What is claimed is:

1. A multilayered ceramic capacitor comprising:
   first planer internal electrodes in electrical contact with a first external termination;
   second planer internal electrodes interleaved with said first planer internal electrodes wherein said second planer internal electrodes are in electrical contact with a second external termination;
   a dielectric between said first planer internal electrodes and said second planer internal electrodes; and
   at least one of said first external termination and said second external termination comprises transient liquid phase sintering adhesive between at least one of said first external termination and said first planer internal electrodes or said second external termination and said second planer internal electrodes wherein said transient liquid phase sintering adhesive has a melting point of above 300° C.

2. The multilayered ceramic capacitor of claim 1 further comprising a first lead in electrical contact with said first external termination and a second lead in electrical contact with said second external termination.

3. The multilayered ceramic capacitor of claim 2 wherein said first lead is plated with a material comprising at least one of nickel, copper, gold, silver, tin, palladium and lead.

4. The multilayered ceramic capacitor of claim 2 wherein at least one of said first lead or said second lead is a non-ferrous material or a ferrous material.

5. The multilayered ceramic capacitor of claim 4 wherein said non-ferrous material is selected from copper, phosphor bronze, brass and beryllium copper.

6. The multilayered ceramic capacitor of claim 4 wherein said ferrous material is selected from Alloy 42 and Kovar.

7. The multilayered ceramic capacitor of claim 2 further comprising a second capacitive component wherein said second capacitive component comprises:
   third planer internal electrodes in electrical contact with a third external termination;
   fourth planer internal electrodes interleaved with said third planer internal electrodes wherein said fourth planer internal electrodes are in electrical contact with a fourth external termination;
   a second dielectric between said first planer internal electrodes and said second planer internal electrodes; and
   said third external termination is in electrical contact with said first lead and said fourth external termination is in electrical contact with said second lead.

8. The multilayered ceramic capacitor of claim 7 wherein said first external termination is a first distance from said first lead and said third external termination is a second distance from said first lead.

9. The multilayered ceramic capacitor of claim 8 wherein said first distance and said second distance have a difference of no more than 2.54 mm.

10. The multilayered ceramic capacitor of claim 9 wherein said first distance and said second distance have a difference of no more than 0.254 mm.

11. The multilayered ceramic capacitor of claim 7 wherein said third external termination is separated from said first external termination by less than 0.254 mm.

12. The multilayered ceramic capacitor of claim 1 wherein said first, high melting temperature component of the transient liquid phase sintering adhesive comprises at least one member selected from the group consisting of copper, silver, aluminum, gold, platinum, palladium, beryllium, rhodium nickel, cobalt, iron and molybdenum or an alloy of said member.

13. The multilayered ceramic capacitor of claim 1 wherein said second, low melting temperature component of the transient liquid phase sintering adhesive comprises at least one member selected from the group consisting of tin, antimony, bismuth, cadmium, zinc, gallium, indium, tellurium, mercury, thallium, selenium and polonium or an alloy said member.

14. The multilayered ceramic capacitor of claim 1 wherein said transient liquid phase sintering adhesive does not comprise lead.

15. The multilayered ceramic capacitor of claim 1 further comprising a first lead frame in electrical contact with said first external termination wherein said first lead frame is attached to said first external termination.

16. The multilayered ceramic capacitor of claim 15 wherein said first lead frame is plated with a material comprising at least one of nickel, copper, gold, silver, tin, palladium and lead.

17. The multilayered ceramic capacitor of claim 15 wherein said first lead frame is coated with Ni or Cu and overcoating Sn, Ag, Au, Pd, Rh, Pt, Pb, Cu or alloys thereof.

18. The multilayered ceramic capacitor of claim 1 wherein said transient liquid phase sintering adhesive has a melting point of above 400° C.

\* \* \* \* \*